US012609697B2

(12) United States Patent
Piessens et al.

(10) Patent No.: US 12,609,697 B2
(45) Date of Patent: Apr. 21, 2026

(54) BACKPOWER-SAFE TEST SWITCH

(71) Applicant: INVENSENSE, INC., San Jose, CA (US)

(72) Inventors: Tim Piessens, Bornem (BE); Robin Croon, Leuven (BE); Athanasios Sarafianos, Landen (BE)

(73) Assignee: INVENSENSE, INC., San Jose, CA (US)

( * ) Notice: Subject to any disclaimer, the term of this patent is extended or adjusted under 35 U.S.C. 154(b) by 197 days.

(21) Appl. No.: 18/511,786

(22) Filed: Nov. 16, 2023

(65) Prior Publication Data

US 2024/0171174 A1 May 23, 2024

Related U.S. Application Data

(60) Provisional application No. 63/426,880, filed on Nov. 21, 2022.

(51) Int. Cl.
| | | |
|---|---|---|
| *G01R 31/28* | (2006.01) | |
| *H03K 17/68* | (2006.01) | |
| *H03K 17/687* | (2006.01) | |

(52) U.S. Cl.
CPC ..... *H03K 17/6871* (2013.01); *G01R 31/2884* (2013.01)

(58) Field of Classification Search
CPC ........................ H03K 17/6871; G01R 31/2884
See application file for complete search history.

(56) References Cited

U.S. PATENT DOCUMENTS

| | | | |
|---|---|---|---|
| 7,080,264 B2 | 7/2006 | Mahony et al. | |
| 9,053,655 B2 | 6/2015 | Hori | |
| 10,558,609 B2 | 2/2020 | Tailliet et al. | |
| 10,705,594 B2 | 7/2020 | Srivastava | |
| 11,487,684 B2 | 11/2022 | Kee | |
| 11,494,329 B2 | 11/2022 | Krishnapillai et al. | |
| 11,545,824 B2 | 1/2023 | Buhari | |
| 2003/0196139 A1* | 10/2003 | Evans .............. | G01R 31/31903 |
| | | | 714/25 |
| 2005/0253626 A1* | 11/2005 | Chong ..................... | G06F 1/28 |
| | | | 326/82 |
| 2015/0356051 A1 | 12/2015 | Benson et al. | |
| 2015/0362362 A1* | 12/2015 | Pan .......................... | H04R 3/00 |
| | | | 73/645 |
| 2015/0363353 A1 | 12/2015 | Enami et al. | |
| 2019/0265293 A1* | 8/2019 | Fifield ................ | G01R 31/2879 |
| 2021/0136493 A1* | 5/2021 | Berthelsen ........... | H03G 3/3005 |

OTHER PUBLICATIONS

"Eliminate Power Sequencing With Powered-Off Protection Signal Switches" Texas Instruments (Application Brief) [https://www.ti.com/lit/an/scda015c/scda015c.pdf?ts=1676650917168&ref_url=https%253A%252F%252Fwww.google.com%252F], Jan. 2019, 3 pages.

* cited by examiner

*Primary Examiner* — Henry Tsai
*Assistant Examiner* — Harry Z Wang
(74) *Attorney, Agent, or Firm* — Amin, Turocy & Watson, LLP

(57) ABSTRACT

Disclosed embodiments provide backpower-safe test switches, devices, systems, and methods. By maintaining high impedance on an existing communications bus integrated circuit pin, disclosed embodiments prevent backpower of integrated circuits even when the integrated circuits are powered off. In a non-limiting aspect, disclosed embodiments facilitate increased final ASIC test coverage by facilitating multiplexing analog test bus on an existing ASIC pin.

18 Claims, 7 Drawing Sheets

700

ASIC 702

BACKPOWER SAFE TEST SWITCH
704

FIRST SWITCHING
COMPONENT
706

SECOND
SWITCHING
COMPONENT
708

BACKPOWER-SAFE TEST SWITCH

CROSS REFERENCE TO RELATED APPLICATIONS

This application claims the benefit of and priority to U.S. Provisional Application No. 63/426,880, filed Nov. 21, 2022, entitled "BACK-POWER SAFE TEST SWITCH," the content of which application is hereby expressly incorporated by reference herein in its entirety.

TECHNICAL FIELD

The subject disclosure relates to production testing of multiplexed electronic devices on a communications bus, and more particularly to backpower-safe test switches, devices, systems, and methods therefor.

BACKGROUND

Electronic devices are developed and brought to market with an ever-increasing array for subcomponents that can expand and implement advanced features and desirability of the devices, the implementation of which require communication and control. For instance, an electronic device may contain any number of subcomponents including, but not limited to, sensors including microelectromechanical systems (MEMS) sensors, electronic memories, analog-to-digital converters (ADCs), digital-to-analog converters (DACs), potentiometers and resistors, cryptographic and/or authentication devices, real-time clocks, touch sensor drives, LED drivers, fan controllers, and so on. The characteristics that these subcomponents have in common is that they are typically designed to follow a standard communications protocol such that they may be multiplexed on a communications bus for communication and control to realize the advanced features.

However, while such devices and associated application specific integrated circuits (ASICs) are being developed, it is useful to test any one or more of such ASICs to the maximum extent economically feasible, while limiting any amount of additional ASIC pins that are used solely for testing. One option is to multiplex an analog test bus on a pre-existing ASIC pin, which can risk backpowering the ASIC via one or more of the other multiplexed devices in the final product, in the event that the ASIC is powered off.

It is thus desired to provide backpower-safe test switches that improve upon these and other deficiencies. The above-described deficiencies are merely intended to provide an overview of some of the problems of conventional implementations, and are not intended to be exhaustive. Other problems with conventional implementations and techniques and corresponding benefits of the various aspects described herein may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, disclosed embodiments provide backpower-safe test switches, devices, systems, and methods. Disclosed embodiments maintain high impedance on an existing communications bus package pin, thereby preventing backpower of integrated circuits even when the integrated circuits are powered off. In a non-limiting aspect, disclosed embodiments facilitate increased final ASIC test coverage by facilitating multiplexing analog test bus on existing ASIC pins.

These and other embodiments are described in more detail below.

BRIEF DESCRIPTION OF THE DRAWINGS

Various non-limiting embodiments are further described with reference to the accompanying drawings in which.

DETAILED DESCRIPTION

Overview

Figure 1:
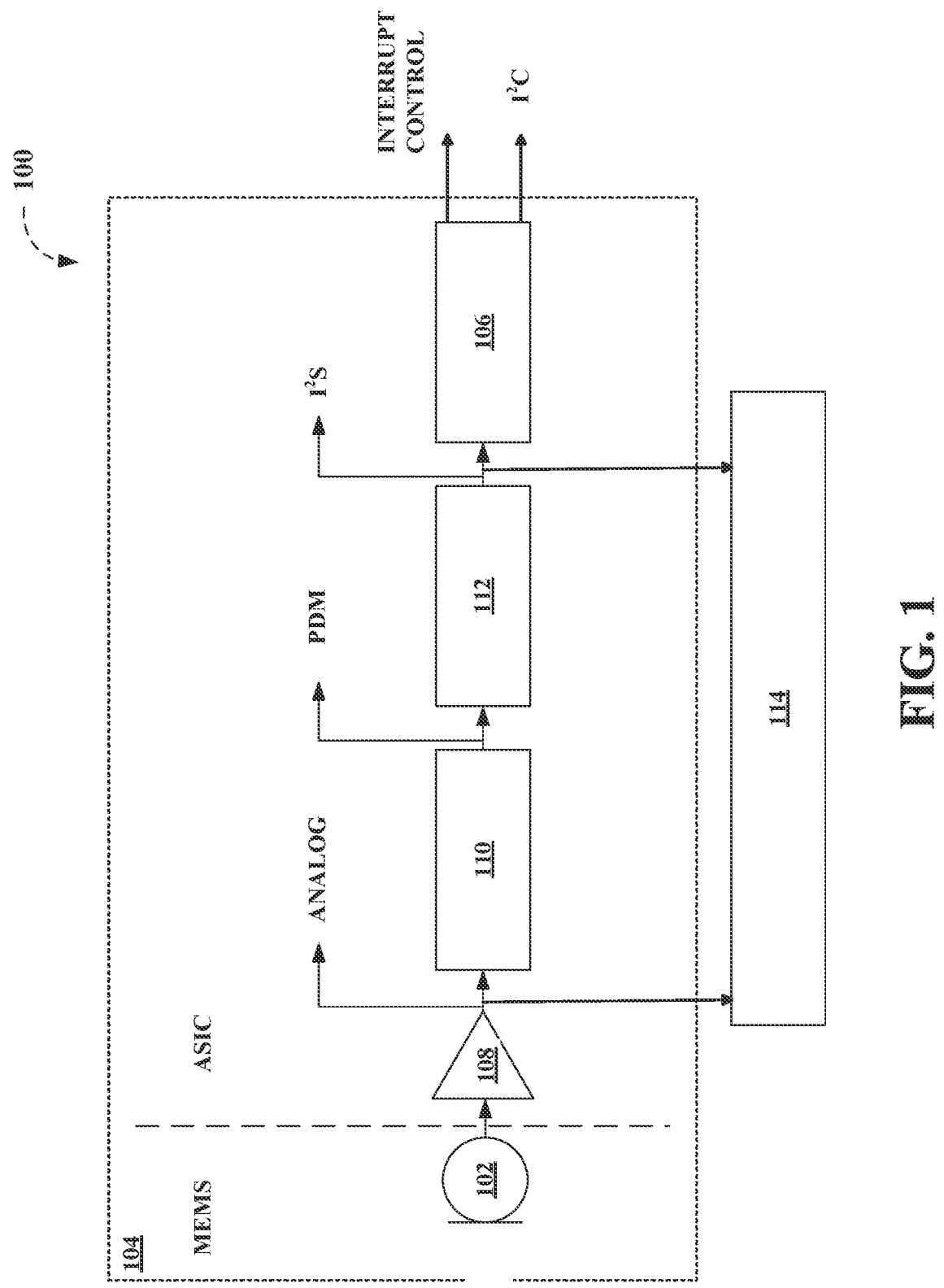
FIG. 1 depicts an exemplary operating environment comprising a non-limiting apparatus package suitable for incorporation of various disclosed aspects.

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

As described above, in a given consumer product, the amount of pins in a device package and associated ASIC is fixed (e.g., by external design requirements, size requirements, pin compatibility requirements) and limited. As a result, this can restrict the amount of tests able to be performed on associated ASICs in final ASIC testing, e.g., reduced final test coverage of the ASICs. One conventional solution is to add additional test pads to the dies/ASICs and performing increased wafer-level testing. Another solution can be to multiplex the analog test bus with multiple tests on existing ASIC pins. However, existing sensors with fixed pins for associated ASICs may not be able to accommodate multiplexed analog tests, as further described herein.

Various embodiments described herein can facilitate increased final test coverage in final ASIC testing by allowing multiplexing of analog test signals on an existing ASIC pin, including ASICs associated with devices that can be multiplexed on an open drain communications bus, whether the associated ASICs are powered on, and thus, can facilitate achieving higher test coverage in final ASIC testing, without the need of adding more pins on associated device ASICs.

To these and/or related ends, various aspects of back-power-safe test switches, devices, systems, and methods therefor are described. Various embodiments of the subject disclosure are described herein for purposes of illustration, and not limitation. For example, embodiments of the subject disclosure are described herein in the context of a MEMS sensor, such as a MEMS acoustic sensor. However, it can be appreciated that the subject disclosure is not so limited. However, as further detailed below, various exemplary implementations can be applied to other areas of MEMS sensor design and/or packaging, without departing from the subject matter described herein.

For example, the various embodiments of the apparatuses, techniques, and methods of a flexible backpower-safe test switch may be employed in any of a number of electronic devices including, but not limited to, sensors including MEMS sensors, electronic memories, ADCs), digital-to-analog converters (DACs), potentiometers and resistors, cryptographic and/or authentication devices, real-time clocks, touch sensor drives, LED drivers, fan controllers, and so on, as further described herein. In addition, the subject disclosure enables increased final ASIC test coverage by facilitating multiplexing analog test bus on existing ASIC pins. In addition, various aspects of disclosed embodiments can maintain high impedance on an existing communications bus package pin, thereby preventing backpower of integrated circuits even when the integrated circuits are powered off.

Exemplary Embodiments

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, parameters, etc. In other instances, well-known structures, components, circuits, devices, and so on are shown in block diagram form to facilitate description and illustration of the various embodiments.

FIG. 1 depicts an exemplary operating environment comprising a non-limiting apparatus package 100 suitable for incorporation of various disclosed aspects. For instance, FIG. 1 depicts a functional block diagram of an exemplary apparatus that can comprise a microelectromechanical systems (MEMS) sensor or other electronic device package 100. As described, exemplary embodiments are described herein as implementations associated with MEMS sensors such as an exemplary MEMS acoustic sensor or microphone 102 for the purposes of illustration and not limitation.

As such, it can be understood that the various disclosed aspects can be implemented regarding any of a variety of electronic devices and combinations thereof including, but not limited to, MEMS sensors, electronic memories, ADCs, DACs, potentiometers and resistors, cryptographic and/or authentication devices, real-time clocks, touch sensor drives, LED drivers, fan controllers, and so on. Thus, in a non-limiting embodiment, sensor or other electronic device package 100 can comprise a MEMS acoustic sensor or microphone 102 in a device package 104 with an associated application specific integrated circuit (ASIC) 104 and digital signal processor (DSP) 106, according to various non-limiting aspects of the subject disclosure. In a further aspect, DSP 106 can process signals from MEMS acoustic sensor or microphone 102 to perform various functions including providing sensor data (e.g., analog, pulse density modulation (PDM) signals, Integrated Interchip Sound (I$^2$S) signals, information, and/or data) and/or control signals (e.g., interrupt control signals, Inter-Integrated Circuit (I$^2$C) Protocol control signals) to other electronic components (not shown), receiving control signals (e.g., interrupt control signals, I$^2$C control signals), and the like.

For instance, DSP 106 can include I$^2$C and/or interrupt functionality to send control signals to system processors (not shown), external devices (not shown) associated with the sensor or other electronic device package 100, and/or application processors (not shown) of devices such as a feature phones, smartphones, smart watches, tablets, eReaders, netbooks, automotive navigation devices, gaming consoles or devices, wearable computing devices, and the like. Thus, exemplary sensor or other electronic device package 100 can be configured, via ASIC 104, DSP 106, or otherwise, to interface with a communications bus via a pin (not shown) of a sensor or other electronic device package 100 comprising ASIC 104 according to a communications protocol. In the non-limiting example of FIG. 1, the ASIC 104 can be configured to interface with a communications bus comprising an I$^2$C bus according to the I$^2$C protocol, which is a protocol intended to allow multiple peripheral digital integrated circuits to communicate with one or more controller integrated circuits.

In further non-limiting aspects, sensor or other electronic device package 100 can further comprise a buffer amplifier 108, an analog-to-digital converter (ADC) 110, and a decimator 112 to process signals from MEMS acoustic sensor or microphone 102. In the non-limiting example of sensor or other electronic device package 100 comprising MEMS acoustic sensor or microphone 102, MEMS acoustic sensor or microphone 102 is shown communicably coupled to an external codec or processor 114 that can employ analog and/or digital audio signals (e.g., pulse density modulation (PDM) signals, Integrated Interchip Sound (I$^2$S) signals, information, and/or data) as is known in the art. However, as with the MEMS acoustic sensor or microphone 102 and associated buffer amplifier 108, ADC 110, and decimator 112, it should be understood that external codec or processor 114 is not necessary to enable the scope of the various embodiments described herein.

It can be understood that the various signals emanating from or destined to the sensor or other electronic device package 100 are made via a number of package pins (not shown). For various reasons, such as backwards compatibility, economy, and/or other design considerations, the number of pins (including associated ASIC 104 pins), their placement on sensor or other electronic device package 100, and their functions should be considered relatively fixed, such that reuse of such pins (including associated ASIC 104 pins) to achieve a function not previously supported should be accomplished whenever possible. Thus, sensor or other electronic device package 100 can be configured to interface with a communications bus via a pin of a package comprising the ASIC 104 according to a communications protocol, as further described herein.

Figure 2:
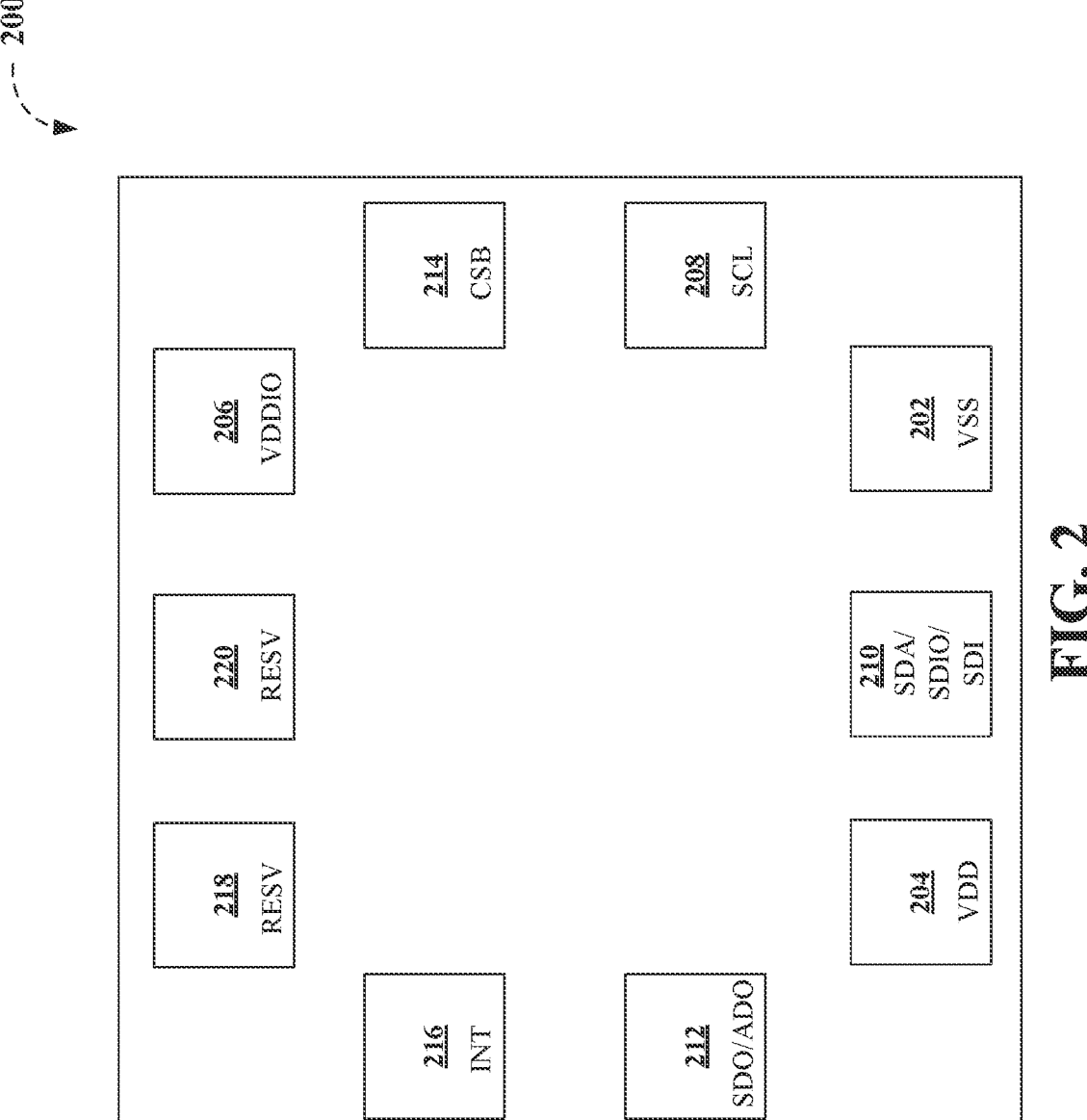
FIG. 2 depicts another exemplary operating environment comprising a non-limiting apparatus package that illustrates further aspects of the disclosed subject matter.

For instance, FIG. 2 depicts another exemplary operating environment comprising a non-limiting apparatus package 200 that illustrates further aspects of the disclosed subject matter. FIG. 2 depicts a pinout diagram for an exemplary apparatus package 200, which, in a non-limiting aspect, can comprise a sensor (not shown) such as a pressure sensor or other electronic device. It is understood that reference to a pressure sensor is immaterial, is merely contextual, and is not necessary to enable the scope of the various embodiments described herein.

In a non-limiting aspect, pin 202 VSS can comprise a Power Supply Ground pin. In another non-limiting aspect, pin 204 VDD can comprise a Power Supply Voltage pin. According to still other non-limiting aspects, pin 206 VDDIO can comprise a Input/Output (IO) Power Supply pin. Exemplary apparatus package 200 can comprise a pin 208 SCL, which can comprise a Serial Clock pin suitable for implementation of Improved Inter Integrated Circuit (I²C), I²C, and/or Serial Peripheral Interface (SPI) communications and/or control.

In another non-limiting aspect, exemplary apparatus package 200 can comprise a pin 210 SDA/SDIO/SDI, which can comprise a pin suitable for SDA, I³C/I²C serial data, SDIO, SPI serial data I/O (3-wire mode), and/or SDI, SPI serial data input (4-wire mode). In addition, exemplary apparatus package 200 can comprise a pin 212 SDO/ADO, which can comprise a pin suitable for SDO, SPI serial data output (4-wire mode), ADO, I³C/I²C slave addressing. In further non-limiting aspects, pin 214 CSB can comprise a SPI Chip Select pin, pin 216 INT can comprise a Interrupt Output pin, and pins 218 RESV and 220 RESV can be reserved and connected to ground.

As described above, the number, placement, and function of exemplary apparatus package 200 pins (including associated ASIC (not shown) pins) should be considered fixed when attempting to add functionality to previously existing apparatus package 200 pins (and/or associated ASIC (not shown) pins) and associated functionality. In addition, exemplary apparatus package 200 can be configured to interface with a communications bus via a pin of a package comprising an ASIC (not shown) according to a communications protocol, as further described herein.

Figure 3:
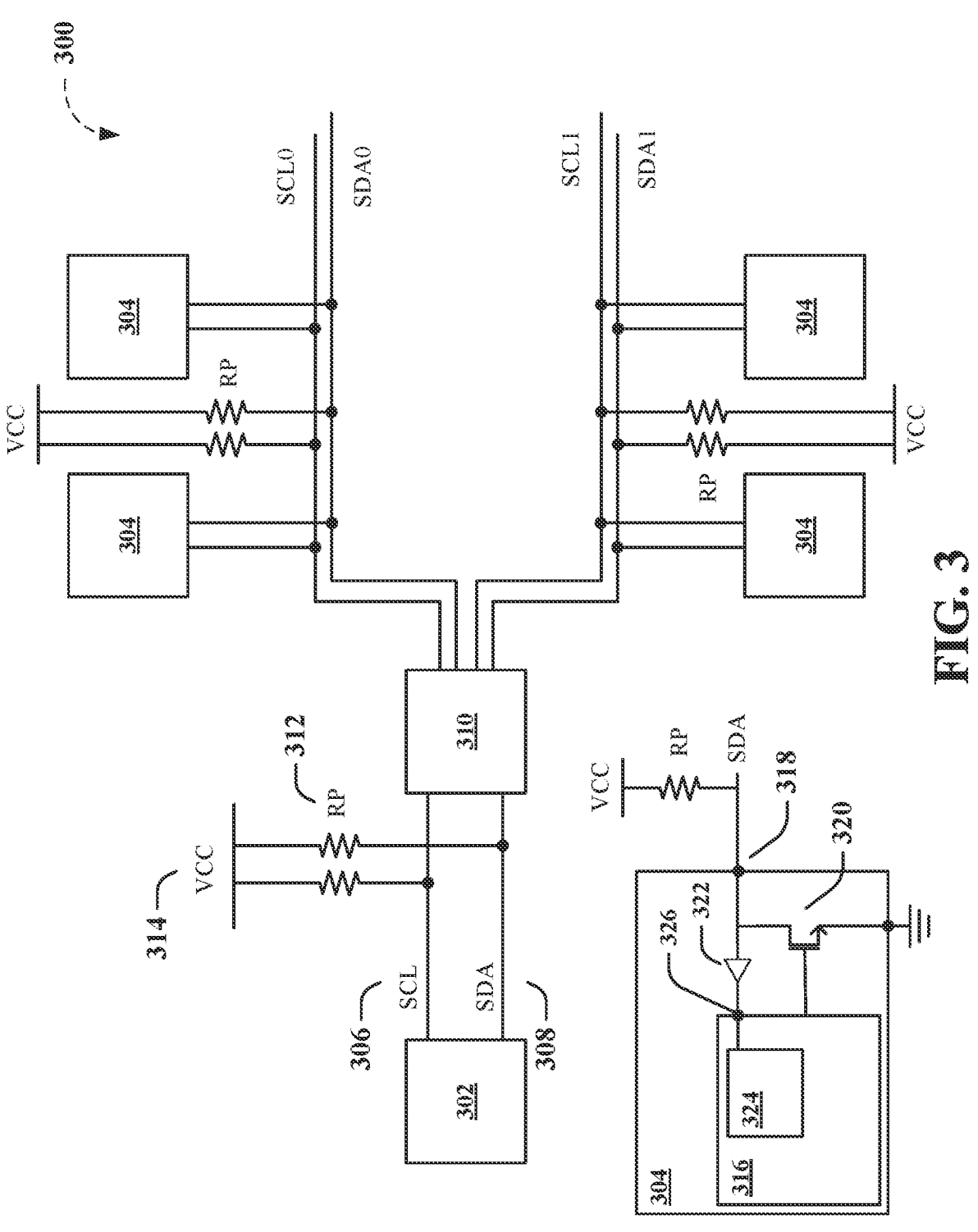
FIG. 3 depicts a block diagram of another exemplary operating environment comprising a multiplexed, open drain communications bus that demonstrates further aspects of the disclosed subject matter.

For example, FIG. 3 depicts a block diagram of another exemplary operating environment comprising a multiplexed, open drain communications bus 300 that demonstrates further aspects of the disclosed subject matter. Multiplexed, open drain communications bus 300 can comprise one or more microcontroller or processer 302 that can serve as a communications bus 300 master for the one or more slave devices 304 that are multiplexed for communication and/or control through two wires, SCL 306, Serial Clock, and SDA 308, Serial Data. As described herein, the one or more slave devices 304 can comprise one or more electronic devices and combinations thereof including, but not limited to, MEMS sensors or other devices, electronic memories, ADCs, DACs, potentiometers and resistors, cryptographic and/or authentication devices, real-time clocks, touch sensor drives, LED drivers, fan controllers, I/O expanders, data converters, and so on.

The depicted multiplexed, open drain communications bus 300 of FIG. 3 can further comprise a multiplexer 310 for selective communication from among the one or more slave devices 304. As used herein, the term, open drain, refers to the capability of the one or more devices including the one or more slave devices 304 on communications bus 300 either pulling the bus down to a voltage (e.g., ground), to signal pending communication on the multiplexed, open drain communications bus 300, or to release the multiplexed, open drain communications bus 300, and allowing the multiplexed, open drain communications bus 300 to be pulled up by associated pull-up resistors, RP 312, to power supply voltage, Vcc 314. Upon releasing the multiplexed, open drain communications bus 300 by the communications bus 300 master or the one or more slave devices 304, associated pull-up resistors, RP 312, pull bus voltage up to power supply voltage, Vcc 314, which is interpreted as a logical high according to the associated communications bus protocol.

In non-limiting aspects, the one or more slave devices 304 can comprise logic 316 such as can be associated with an ASIC (not shown) that can be configured to interface with the multiplexed, open drain communications bus 300 via a pin 318 of a package comprising an ASIC (not shown) according to the communications protocol of the multiplexed, open drain communications bus 300. In further non-limiting aspects, the one or more slave devices 304 can employ an open-drain (or open collector) such as via a pull-down field effect transistor (FET) 320 with an input buffer 322 on the same line, which allows a single data line, SDA 308, to be used for communication to and from the one or more slave devices 304 on the multiplexed, open drain communications bus 300. Accordingly, the one or more slave devices 304 on communications bus 300 can pull the bus down to ground via the open drain to signal pending communication on the multiplexed, open drain communications bus 300, or can release the multiplexed, open drain communications bus 300, by switching off pull-down FET 320, and let the multiplexed, open drain communications bus 300 be pulled up by associated pull-up resistors, RP 312, to power supply voltage, Vcc 314.

In a non-limiting aspect, exemplary multiplexed, open drain communications bus 300 can be configured according to the Inter-Integrated Circuit (I²C) Protocol. It can be understood that, for a variety of the one or more slave devices 304 (e.g., incorporating or associated with logic/ASIC 316) that can be multiplexed on the open drain communications bus 300, final ASIC testing can be difficult or infeasible while minimizing additional ASIC test pins, and without multiplexing an analog test bus on an existing ASIC pin. For instance, in an implementation of I²C communications bus, an open drain system with a pull up resistance (most of the time at the host controller) is intended to cause the data pin (e.g., pin 210 SDA/SDIO/SDI, pin 318) to be held high, when devices are communicating on the I²C bus.

Increasing the test coverage on the final ASIC while reducing the amount of new or additional pins on a package requires further multiplexing on the communications bus for test access to the one or more slave devices 304 with the preexisting pins. For instance, exemplary embodiments of logic/ASIC 316 can comprise or be associated with an exemplary backpower-safe test switch 324, which can facilitate employing an existing pin 326 as a test pin, while avoiding potential risks of backpowering exemplary logic/ASIC 316 once it is assembled into a system with other devices multiplexed on the open drain communications bus 300. However, as described above, when multiplexing analog tests on I²C SDA pin on logic/ASIC 316 (e.g., existing pin 326), the open drain/input buffer of these pins need to remain back power compatible. That is, while the open drain bus is convenient from an operational communication and control standpoint in final assembled devices, once the devices are multiplexed on the open drain communications bus 300 the SDA pins 318 will be forced high, even when the one or more slave devices 304 might be unpowered in the final assembled device. Thus, even when logic/ASIC 316 of the one or more slave devices 304 is not supplied (e.g., ASIC unpowered, Vsupply/VDDIO=0), without more to keep the impedance on the data pin (e.g., pin 210 SDA/SDIO/SDI, pin 318) high, the impedance on the data pin (e.g., existing pin 326) is variable, and logic/ASIC 316 is subject to being back powered from the power supply voltage, Vcc 314.

For instance, when a exemplary backpower-safe test switch 324 is connected at the data pin (e.g., existing pin 326) of the one or more slave devices 304, with the associated ASIC is powered off, exemplary backpower-safe test switch 324 should not leak even when it has no supply. In a further non-limiting aspect, when logic/ASIC 316 is assembled into a final product, exemplary backpower-safe test switch 324 should not be turned on by an external power source (e.g., one or more devices multiplexed on the open drain communications bus 300), which could damage the I²C communication ability on the I²C bus when the ASIC is not supplied (e.g., ASIC Vsupply/VDDIO=0). In other words, an electronic device configured with a variety of I²C bus devices (e.g., a variety of the one or more slave devices 304) can have multiple devices (e.g., multiple of the one or more slave devices 304) powered up and communicating on the I²C bus. However, in the event that one of the one or more multiplexed slave devices 304 and associated logic/ASIC 316 were powered down, while the I²C open drain system with pull up resistance causes the data pin (e.g., pin 210 SDA/SDIO/SDI, pin 318) is held high, such as when devices are communicating on the I²C bus, as described, exemplary backpower-safe test switch 324 would protect the associated logic/ASIC 316 from being backpowered.

In addition, increasingly, it may be desired from a reduced power consumption standpoint to not power all of the one or more slave devices 304 all of the time, which could be accommodated by configuring the one or more slave devices 304 on separate I²C buses, with the attendant cost. Alternatively, by multiplexing an analog test bus on existing pin 326, such as an I²C pin, test access can be maintained according to various aspects of a backpower-safe test switch 324, which prevents the aforementioned problems created by allowing unpowered devices on the I²C bus. Thus, by employing embodiments of a backpower-safe test switch 324 according to various aspects described herein, test access to ASICs associated with multiplexed devices on open drain communications buses can be maintained in final ASIC tests, by ensuring that powered off slave devices 304 incorporating exemplary backpower-safe test switch 324 are not back powered, by devices communicating on the multiplexed, open drain communications bus 300.

Figure 4:
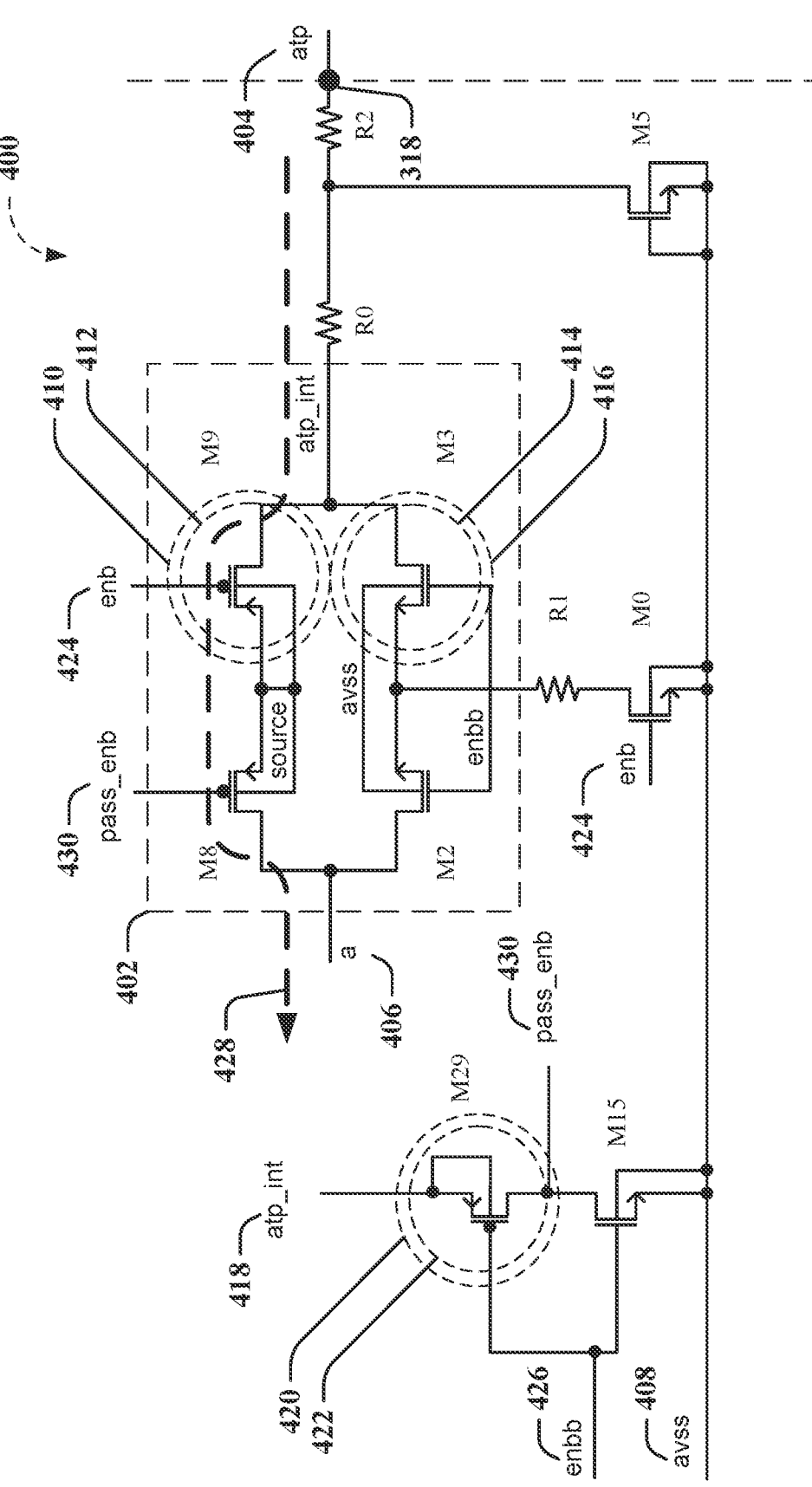
FIG. 4 depicts a non-limiting embodiment of an exemplary backpower-safe test switch, according to aspects of the subject disclosure.

For example, FIG. 4 depicts a non-limiting embodiment of an exemplary backpower-safe test switch 400, such as described above regarding exemplary backpower-safe test switch 324, according to aspects of the subject disclosure. In non-limiting embodiments, exemplary backpower-safe test switch 400 can be configured as a back to back transmission gate 402, incorporated into an exemplary logic/ASIC 316, for example, as described herein regarding the one or more slave devices 304, non-limiting apparatus package 100, non-limiting apparatus package 200, and so on. As described, the one or more slave devices 304, non-limiting apparatus package 100, non-limiting apparatus package 200, comprising an exemplary logic/ASIC 316 employing an exemplary backpower-safe test switch 400 can be multiplexed on open drain communications bus 300, as described above regarding FIG. 3, at a data pin (e.g., pin 210 SDA/SDIO/SDI, pin 318) of the one or more slave devices 304, non-limiting apparatus package 100, non-limiting apparatus package 200, and so on. As such, exemplary back to back transmission gate 402 can send/receives signals (e.g., atp 404) on pin 318 and send/receive signals (e.g., a 406) to the associated logic/ASIC 316 (not shown) of the one or more slave devices 304, non-limiting apparatus package 100, non-limiting apparatus package 200, and so on comprising the logic/ASIC 316 (not shown) and backpower-safe test switch 400.

In a non-limiting aspect, exemplary back to back transmission gate 402 can comprise back to back positive-channel metal oxide semiconductor field effect transistor (MOSFET) (e.g., PMOS transistors M8, M9) with back to back negative-channel MOSFET (e.g., NMOS transistors M2, M3) with a pull-down NMOS MO (e.g., such as with pull-down FET 320) tied to ground, avss 408. In further non-limiting aspects, PMOS transistor M9 outer P+ ring 410 is connected to ground, avss 408, whereas inner N+ ring 412 is connected to bulk. In still other non-limiting aspects, NMOS transistor M3 inner P+ ring 414 is connected to ground, avss 408, whereas outer N+ ring 416 is connected to Vcore.

In normal operation of the multiplexed open drain communications bus 300 the pull up requirement will cause the signals (e.g., atp 404) on pin 318 to be exposed to a high voltage Vcc, even when ASIC (not shown) of the one or more slave devices 304, non-limiting apparatus package 100, non-limiting apparatus package 200, and so on comprising the ASIC (not shown) are not powered (e.g., no Vsupply/VDDIO supply to ASIC). In further embodiments, exemplary backpower-safe test switch 400 can comprise a PMOS transistor M29 and NMOS transistor (e.g., NMOS transistor M15) and associated control circuitry connecting upper PMOS transistor M29 to the gate of PMOS transistor M8 of the exemplary back to back transmission gate 402 and atp_int 418, as further described herein. As with PMOS transistor M9, PMOS transistor M29 outer P+ ring 420 is connected to ground, avss 408, whereas inner N+ ring 422 is connected to bulk. As used in reference to FIGS. 4-6, "en" refers to an enable switch, "enb" 424, or enable bar, refers to a not enabling switch, "enbb" 426, or enable bar-bar node, refers to a not not enabling switch, which originate within the digital test controller of the ASIC (not shown). As such, enb 424 and enbb 426 are expected to be 0 volts (V) when the ASIC (not shown) is powered off.

As described, normal operation of the multiplexed open drain communications bus 300 the pull up requirement will cause the signals (e.g., atp 404) on pin 318 to be exposed to a high voltage Vcc, even when ASIC (not shown) of the one or more slave devices 304, non-limiting apparatus package 100, non-limiting apparatus package 200, and so on comprising the ASIC (not shown) are not powered (e.g., no Vsupply/VDDIO supply to ASIC) and enb 424 and enbb 426 are 0 volts. Without PMOS transistor M29 and NMOS transistor (e.g., NMOS transistor M15) and associated control circuitry, with enb 424 at 0V (e.g., pull-down NMOS MO switched off), and with signal at atp 404 (e.g., multiplexed communications bus 300 pin 318) held high, the PMOS (e.g., PMOS transistors M8, M9) side of the back to back transmission gate 402, which have their gate at 0V, because no supply at gate level (e.g., no Vsupply/VDDIO supply to ASIC), with voltage held high at atp 404 (e.g., right hand side of PMOS transistor M9), PMOS transistor M9 would start conducting (e.g., without PMOS transistor M29 and NMOS transistor (e.g., NMOS transistor M15) and associated control circuitry) as shown in FIG. 4 at 428. In any case, the impedance at the open drain communications bus 300, as described above regarding FIG. 3, at a data pin (e.g., pin 210 SDA/SDIO/SDI, pin 318 connected via existing pin 326) would depend on the circuitry at a 406 (e.g., the logic/ASIC 316 (not shown) circuitry) and would not necessarily be held at a high impedance (Z) level, without exemplary backpower-safe test switch 324, 400. Thus, the high voltage level on the open drain communications bus 300 would be propagated into the ASIC (not shown) at a 406 and could backpower portions of the logic/ASIC 316.

However, by employing the PMOS transistor M29 and NMOS transistor (e.g., NMOS transistor M15) and associated control circuitry connecting enbb 426 of PMOS M29 to gate of M8 (e.g., enabling pass_enb 430 control signal) and atp_int 418, the impedance at the open drain communications bus 300, as described above regarding FIG. 3, at a data pin (e.g., existing pin 326) would be held at a high impedance (Z) level, as further described herein.

Figure 5:
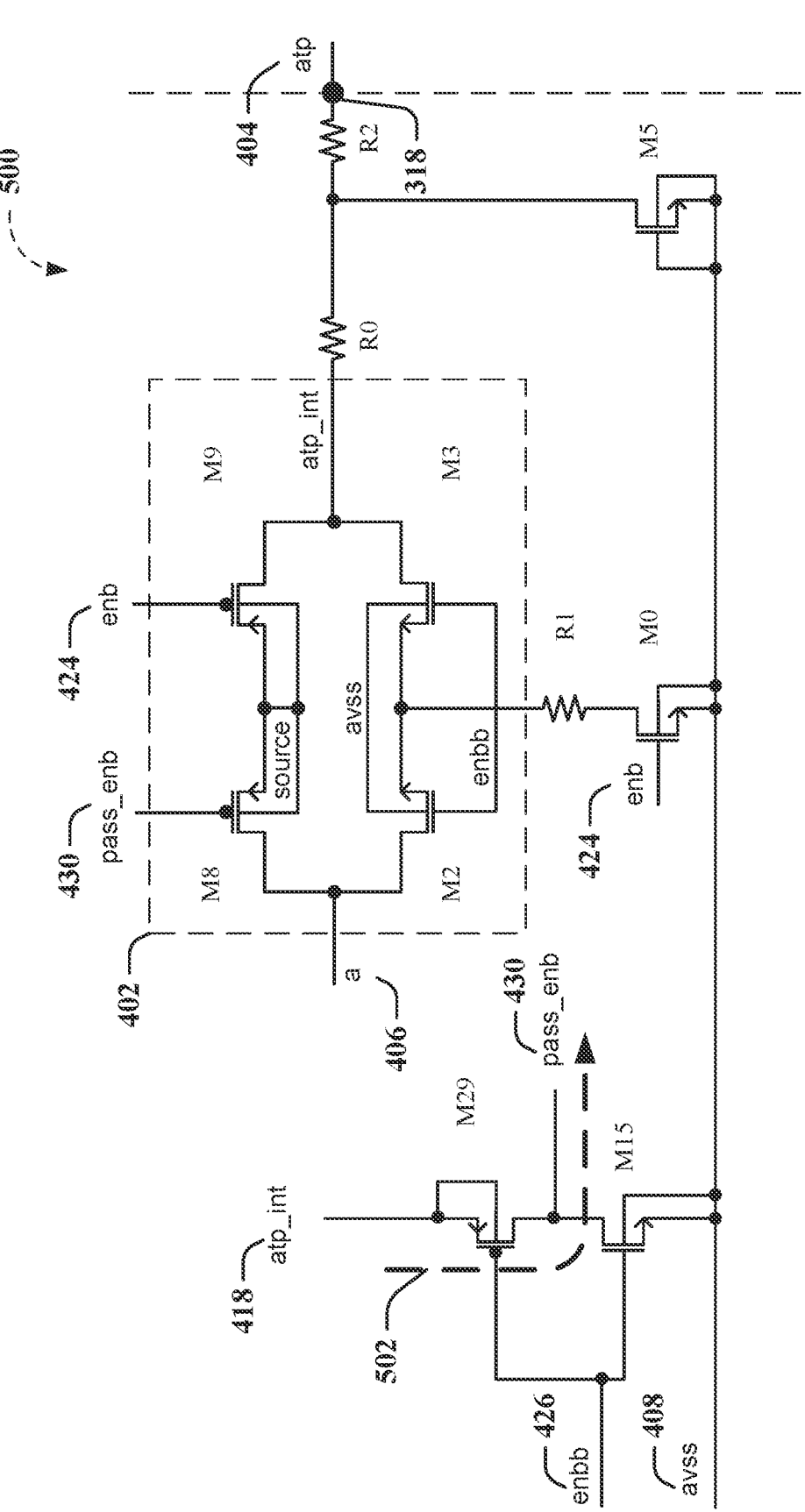
FIG. 5 depicts an exemplary backpower-safe test switch under condition of an associated application specific integrated circuit (ASIC) being powered off and subject to a voltage level applied to a package pin being held at a high level according to a communications protocol for an associated multiplexed, open drain communications bus, according to various aspects of the subject disclosure.

FIG. 5 depicts an exemplary backpower-safe test switch 400 under condition of an associated ASIC being powered off and subject to a voltage level applied to a package pin 318 being held at a high level according to a communications protocol for an associated multiplexed, open-drain communications bus 300, according to various aspects of the subject disclosure. For example, with PMOS transistor M29 and NMOS transistor (e.g., NMOS transistor M15) and associated control circuitry, with enb 424 at 0V (e.g., pull-down NMOS MO switched off), and with signal at atp 404 (e.g., multiplexed communications bus 300 pin 318) held high, the PMOS (e.g., PMOS transistors M8, M9) side of the back to back transmission gate 402, which have their gate at 0V, because no supply at gate level (e.g., no Vsupply/ VDDIO supply to ASIC), with voltage held high at atp 404 (e.g., right hand side of PMOS transistor M9), atp_int 418 is pulled high and applied at PMOS transistor M29. Since enbb 426 is 0V with ASIC (not shown) powered off, PMOS transistor M29 will conduct, shorting atp_int 418 to pass_enb 430 as depicted at 502, which pass_enb 430 is applied to gate of PMOS transistor M8, turning PMOS transistor M8 off thereby preventing backpower of the associated logic/ ASIC 316 (not shown) at a 406.

Since enb 424 is 0V with logic/ASIC 316 (not shown) not powered, even though PMOS transistor M9 is conducting, atp_int 418 will be shorted to voltage of PMOS transistor M8 source via PMOS transistor M29 voltage of pass_enb 430. Thus, PMOS transistor M8 gate-source voltage is zero and PMOS transistor M8 is not conducting, resulting in backpower-safe test switch 400 not conducting, with no leakage from open drain communications bus 300 at atp 404 to the powered off logic/ASIC 316 (not shown) associated with the backpower-safe test switch 400. Thus, by employing the PMOS transistor M29 (and NMOS transistor (e.g., NMOS transistor M15)) and associated control circuitry connecting enbb 426 of PMOS M29 to gate of M8 (e.g., enabling pass_enb 430 control signal) and atp_int 418, the impedance at the open drain communications bus 300, as described above regarding FIG. 3, at a data pin (e.g., pin 210 SDA/SDIO/SDI, pin 318) would be held at a high impedance (Z) level.

Thus, by shorting gate source of the PMOS transmission gate (e.g., PMOS transistor M8) to atp_int 418 established by voltage of the open drain communications bus 300, this ensures that exemplary backpower-safe test switch 400 is off even when the logic/ASIC 316 (not shown) is powered off. That is, when atp 404 is at high voltage level, atp_int 418 is at a high voltage, causing PMOS transistor M29 to conduct (e.g., gate enbb 426 at 0V, S is high V). This will cause pass_enb 430 at PMOS transistor M29 to short to atp_int 418 causing PMOS transmission gate (e.g., PMOS transistor M8) to see atp_int 418 high V at its gate, leading to high gate-source voltage on PMOS transistor M8, thereby turning PMOS transistor M8 off, ensuring that exemplary backpower-safe test switch 400 is off even when the ASIC (not shown) is powered off.

Figure 6:
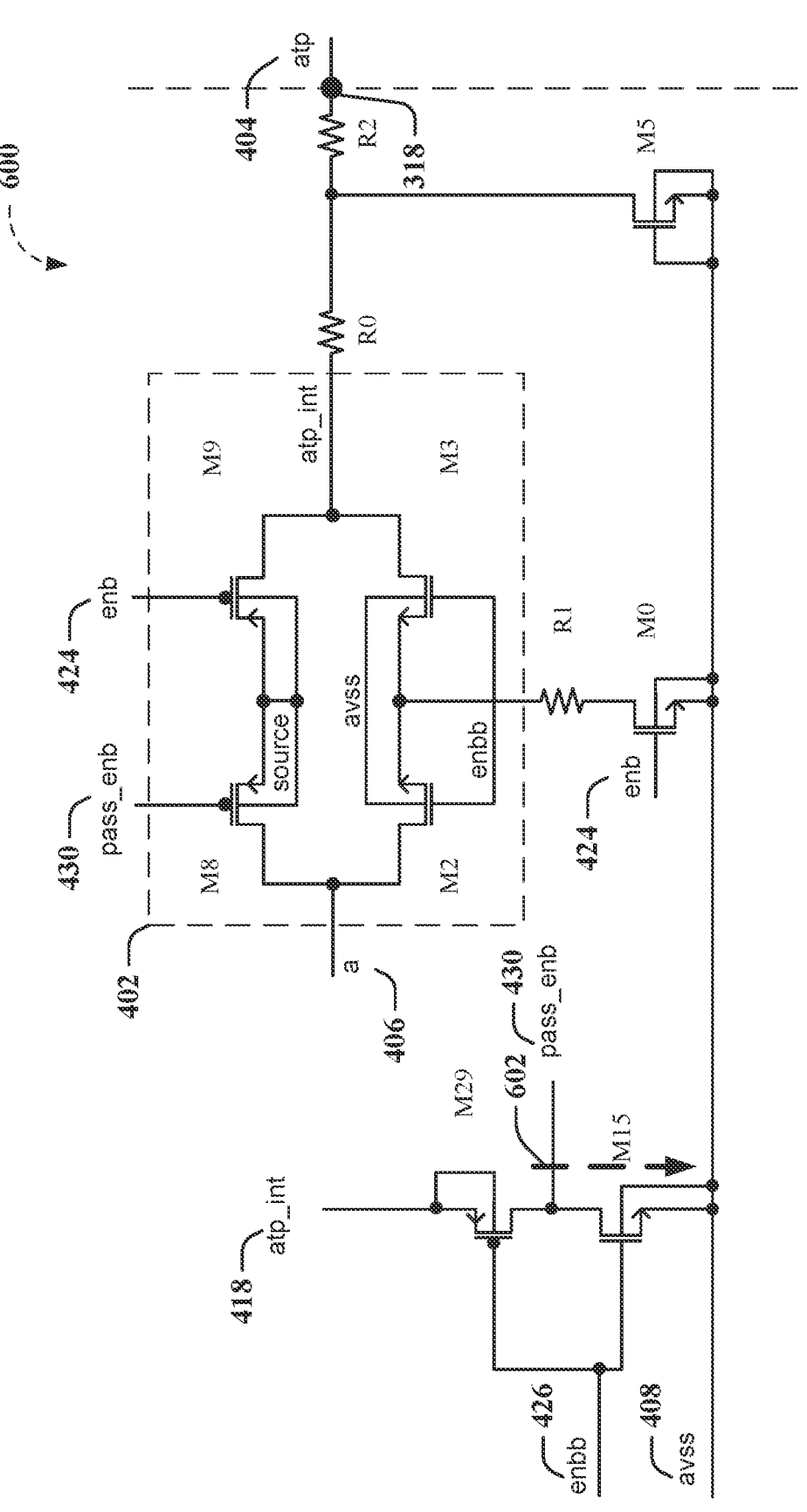
FIG. 6 depicts an exemplary backpower-safe test switch enabling communications via the multiplexed, open drain communications bus at the package pin when the ASIC is powered on, according to further aspects of the subject disclosure.

FIG. 6 depicts an exemplary backpower-safe test switch 400 enabling communications via the multiplexed, open drain communications bus 300 at the package pin 318 (via existing pin 326) when the logic/ASIC 316 is powered on, according to further aspects of the subject disclosure. For example, with NMOS transistor (e.g., NMOS transistor M15) coupled with PMOS transistor M29, various non-limiting embodiments can ensure that when logic/ASIC 316 (not shown) is powered on, enbb 426 signal can be configured to provide the capability for normal communications abilities on the multiplexed, open drain communications bus 300. That is, when the associated logic/ASIC 316 (not shown) is powered on, signal enbb 426 can be employed to turn NMOS transistor (e.g., NMOS transistor M15) on or off. With NMOS transistor (e.g., NMOS transistor M15) conducting, this shorts PMOS transmission gate (e.g., PMOS transistor M8) to ground, avss 408, leading to low gate-source voltage on PMOS transistor M8, thereby turning PMOS transistor M8 on, ensuring that exemplary backpower-safe test switch 400 can enable communications on open drain communications bus 300 as a function of enb 424 and controlled NMOS transistor MO and PMOS transistor M9.

Accordingly, in non-limiting embodiments, the disclosed subject matter provides exemplary apparatuses (e.g., a slave device 304, an apparatus package 100, an apparatus package 200) that can comprise a package (e.g., apparatus package 100, apparatus package 200) comprising an ASIC (e.g., logic/ASIC 316), wherein the ASIC (e.g., logic/ASIC 316) can be configured to interface with a communications bus (e.g., open drain communications bus 300, I²C communications bus) via a pin (e.g., pin 210 SDA/SDIO/SDI, pin 318 associated with existing pin 326) of the package (e.g., apparatus package 100, apparatus package 200) according to a communications protocol (e.g., open drain communications bus 300 protocol, I²C communications bus protocol).

Further non-limiting embodiments of exemplary apparatuses (e.g., a slave device 304, an apparatus package 100, an apparatus package 200) can comprise a PMOS transistor (e.g., PMOS transistor M29) coupled between the pin (e.g., pin 210 SDA/SDIO/SDI, pin 318 associated with existing pin 326) and a gate of a PMOS transmission transistor (e.g., PMOS transistor M8) in a back to back transmission gate, wherein the PMOS transistor (e.g., PMOS transistor M29) can be configured to maintain the PMOS transmission transistor (e.g., PMOS transistor M8) off, with the ASIC (e.g., logic/ASIC 316) powered off, as a voltage level applied to the pin (e.g., pin 210 SDA/SDIO/SDI, pin 318) is held at a high level according to the communications protocol (e.g., open drain communications bus 300 protocol, I²C communications bus protocol).

In a non-limiting aspect, the PMOS transistor (e.g., PMOS transistor M29) can be configured to apply the voltage level applied to the pin (e.g., pin 210 SDA/SDIO/ SDI, pin 318) at the high level to a gate of the PMOS transmission transistor (e.g., PMOS transistor M8) to maintain the PMOS transmission transistor (e.g., PMOS transistor M8) off and to block the voltage level applied to the pin (e.g., pin 210 SDA/SDIO/SDI, pin 318 associated with existing pin 326) at the high level when the ASIC (e.g., logic/ASIC 316) is powered off, for example, as further described herein regarding FIGS. 4-6.

Further non-limiting embodiments of exemplary apparatuses (e.g., a slave device 304, an apparatus package 100, an apparatus package 200) can comprise an NMOS transistor (e.g., NMOS transistor (e.g., NMOS transistor M15)) coupled between the PMOS transistor (e.g., PMOS transistor M29) and ground, and wherein the NMOS transistor (e.g., NMOS transistor (e.g., NMOS transistor M15)) can be configured to turn the PMOS transmission transistor (e.g., PMOS transistor M8) on according an enable signal (e.g., enbb 426) from the ASIC (e.g., logic/ASIC 316) when the ASIC (e.g., logic/ASIC 316) is powered on. In a non-limiting aspect, NMOS transistor (e.g., NMOS transistor M15) can be configured to short the gate of the PMOS transmission transistor (e.g., PMOS transistor M8) to ground to maintain the PMOS transmission transistor (e.g., PMOS transistor M8) on and to pass the voltage level applied to the pin (e.g., pin 210 SDA/SDIO/SDI, pin 318 associated with existing pin 326) at the high level when the ASIC is powered on, for example, as further described herein regarding FIGS. 4-6.

In further non-limiting embodiments of exemplary apparatuses (e.g., a slave device 304, an apparatus package 100, an apparatus package 200), a device comprising the ASIC (e.g., logic/ASIC 316) can be multiplexed on an I²C bus with one or more other device configured to communicate based at least in part on I²C protocols and can be configured to be exposed to the voltage level applied to the pin (e.g., pin 210 SDA/SDIO/SDI, pin 318 associated with existing pin 326) at the high level, for example, as further described herein regarding FIGS. 1-6. According to still further non-limiting embodiments, exemplary apparatuses (e.g., a slave device 304, an apparatus package 100, an apparatus package 200) can be further configured to accept a multiplexed analog test signal on the pin (e.g., pin 210 SDA/SDIO/SDI, pin 318 associated with existing pin 326) without backpowering the ASIC by maintaining a high impedance at the pin (e.g., pin 210 SDA/SDIO/SDI, pin 318 associated with existing pin 326) when the ASIC is powered off, for example, as further described herein regarding FIGS. 1-6.

In addition, exemplary apparatuses (e.g., a slave device 304, an apparatus package 100, an apparatus package 200) as described herein can comprise an ASIC (e.g., logic/ASIC 316) communicatively coupled to one or more MEMS sensors (e.g., exemplary MEMS acoustic sensor or microphone 102, and so on) and configured to process one or more signal from the one or more MEMS sensors. Further exemplary apparatuses (e.g., a slave device 304, an apparatus package 100, an apparatus package 200) as described herein can comprise a package (e.g., apparatus package 100, apparatus package 200) comprising the one or more MEMS sensor and the ASIC (e.g., logic/ASIC 316). Further non-limiting implementations can comprise a pin (e.g., pin 210 SDA/SDIO/SDI, pin 318 associated with existing pin 326) of the package (e.g., apparatus package 100, apparatus package 200) coupled between the ASIC (e.g., logic/ASIC 316) and a communications bus (e.g., open drain communications bus 300, I²C communications bus) according to a communications protocol (e.g., open drain communications bus 300 protocol, I²C communications bus protocol).

In other non-limiting implementations exemplary apparatuses (e.g., a slave device 304, an apparatus package 100, an apparatus package 200) as described herein can comprise a backpower-safe switch (e.g., backpower-safe test switch 400) coupled between the ASIC (e.g., logic/ASIC 316) and the pin (e.g., pin 210 SDA/SDIO/SDI, pin 318 associated with existing pin 326), wherein the backpower-safe switch (e.g., backpower-safe test switch 400) can be configured to provide a high impedance at the pin (e.g., pin 210 SDA/SDIO/SDI, pin 318 associated with existing pin 326) when the ASIC (e.g., logic/ASIC 316) is powered off, and wherein the backpower-safe switch (e.g., backpower-safe test switch 400) can be further configured to enable communications with the communications bus (e.g., open drain communications bus 300, I²C communications bus) according to the communications protocol (e.g., open drain communications bus 300 protocol, I²C communications bus protocol) when the ASIC (e.g., logic/ASIC 316) is powered on. In a non-limiting aspect, an exemplary backpower-safe switch (e.g., backpower-safe test switch 400) can comprise a first switching means for maintaining the high impedance at the pin (e.g., pin 210 SDA/SDIO/SDI, pin 318 associated with existing pin 326) when the ASIC (e.g., logic/ASIC 316) is powered off. In a further non-limiting aspect, exemplary first switching means can comprise a PMOS transistor (e.g., PMOS transistor M29) coupled between the pin (e.g., pin 210 SDA/SDIO/SDI, pin 318 associated with existing pin 326) coupled to the communications bus (e.g., open drain communications bus 300, I²C communications bus) and a gate of a PMOS transmission transistor (e.g., PMOS transistor M8) in a back to back transmission gate, and wherein the PMOS transistor (e.g., PMOS transistor M29) can be configured to maintain the PMOS transmission transistor (e.g., PMOS transistor M8) off as a voltage level applied to the pin (e.g., pin 210 SDA/SDIO/SDI, pin 318 associated with existing pin 326) is held at a high level according to the communications protocol (e.g., open drain communications bus 300 protocol, I²C communications bus protocol), for example, as further described herein regarding FIGS. 4-6.

In another non-limiting aspect, an exemplary backpower-safe switch (e.g., backpower-safe test switch 400) can comprise a second switching means for enabling the communications via the communications bus (e.g., open drain communications bus 300, I²C communications bus) at the pin (e.g., pin 210 SDA/SDIO/SDI, pin 318 associated with existing pin 326) when the ASIC is powered on. In still other non-limiting aspects, exemplary second switching means can comprise an NMOS transistor (e.g., NMOS transistor M15) coupled between the PMOS transistor (e.g., PMOS transistor M29) and ground, and wherein the NMOS transistor (e.g., NMOS transistor M15) can be configured to turn the PMOS transmission transistor (e.g., PMOS transistor M8) on according an enable signal (e.g., enbb 426) from the ASIC (e.g., logic/ASIC 316) when the ASIC (e.g., logic/ASIC 316) is powered on, for example, as further described herein regarding FIGS. 4-6.

As further described herein, for example, regarding FIG. 3, an exemplary communications bus can comprise an open drain communications bus. For instance, for exemplary apparatuses (e.g., a slave device 304, an apparatus package 100, an apparatus package 200) an open drain communications bus can comprise an I²C bus and the communications protocol (e.g., open drain communications bus 300 protocol, I²C communications bus protocol) is an implementation based at least in part on I²C communications protocols. In further exemplary apparatuses (e.g., a slave device 304, an apparatus package 100, an apparatus package 200), an exemplary backpower-safe switch (e.g., backpower-safe test switch 400) can be further configured to accept a multiplexed analog test signal on the pin (e.g., pin 210 SDA/SDIO/SDI, pin 318 associated with existing pin 326) without backpowering the ASIC (e.g., logic/ASIC 316) by maintaining the high impedance at the pin (e.g., pin 210 SDA/SDIO/SDI, pin 318 associated with existing pin 326) when the ASIC (e.g., logic/ASIC 316) is powered off, as further described herein.

Figure 7:
FIG. 7 depicts a block diagram of an exemplary apparatus according to various aspects of the disclosed subject matter.

FIG. 7 depicts a block diagram of an exemplary apparatus 700 according to various aspects of the disclosed subject matter. For example, an exemplary apparatus 700 can comprise a slave device 304, an apparatus package 100, an apparatus package 200) and so on, as further described herein. In a non-limiting aspect, exemplary apparatus 700 can further comprise an ASIC 702 (e.g., such as described above regarding logic/ASIC 316), which can comprise or be associated with a backpower-safe test switch 704, for example, as described herein regarding backpower-safe test switch 324, 400.

Non-limiting embodiments of exemplary apparatus 700 (e.g., slave device 304, apparatus package 100, apparatus package 200) can comprise an ASIC 702 that can be configured to interface with a communications bus (e.g., open drain communications bus 300, I²C communications bus) via a pin (e.g., pin 210 SDA/SDIO/SDI, pin 318 associated with existing pin 326) of a package (e.g., apparatus package 100, apparatus package 200) comprising the ASIC 702 according to a communications protocol (e.g., open drain communications bus 300 protocol, I²C communications bus protocol), for example, as described herein regarding FIGS. 1-3.

In addition, non-limiting embodiments of exemplary apparatus 700 (e.g., slave device 304, apparatus package 100, apparatus package 200) can further comprise a first switching means (e.g., first switching component 706) for maintaining a high impedance at the pin (e.g., pin 210 SDA/SDIO/SDI, pin 318 associated with existing pin 326) when the ASIC 702 is powered off. In a non-limiting aspect, exemplary first switching means (e.g., first switching component 706) can comprise a PMOS transistor (e.g., PMOS transistor M29) coupled between the pin (e.g., pin 210 SDA/SDIO/SDI, pin 318 associated with existing pin 326) connected to the communications bus (e.g., open drain communications bus 300, I²C communications bus) and a gate of a PMOS transmission transistor in a back to back transmission gate (e.g., PMOS transistor M8), and wherein the PMOS transistor (e.g., PMOS transistor M29) can be configured to maintain the PMOS transmission transistor (e.g., PMOS transistor M8) off as a voltage level applied to the pin (e.g., pin 210 SDA/SDIO/SDI, pin 318 associated with existing pin 326) is held at a high level according to the communications protocol (e.g., open drain communications bus 300 protocol, I²C communications bus protocol), for example, as described herein regarding FIGS. 4-6.

Further non-limiting embodiments of exemplary apparatus 700 (e.g., slave device 304, apparatus package 100, apparatus package 200) can comprise a second switching means (e.g., second switching component 708) for enabling communications via the communications bus (e.g., open drain communications bus 300, I²C communications bus) at the pin (e.g., pin 210 SDA/SDIO/SDI, pin 318 associated with existing pin 326) when the ASIC 702 is powered on. In another non-limiting aspect, exemplary second switching means (e.g., second switching component 708) can comprise an NMOS transistor (e.g., NMOS transistor (e.g., NMOS transistor M15)) coupled between the PMOS transistor (e.g., PMOS transistor M29) and ground, and wherein the NMOS transistor can be configured to turn the PMOS transmission transistor (e.g., PMOS transistor M8) on according an enable signal (e.g., enbb 426) from the ASIC 702 when the ASIC 702 is powered on, for example, as described herein regarding FIGS. 4-6.

Further non-limiting embodiments of exemplary apparatus 700 (e.g., slave device 304, apparatus package 100, apparatus package 200) can comprise one or more MEMS sensors in the package (e.g., apparatus package 100, apparatus package 200) comprising one or more of an acoustic sensor, a pressure sensor, a temperature sensor, an accelerometer, a vibratory rate gyroscopic sensor, or an environmental sensor. In other non-limiting embodiments of exemplary apparatus 700 (e.g., slave device 304, apparatus package 100, apparatus package 200), exemplary ASIC 702 can be configured to accept a multiplexed analog test signal on the pin (e.g., pin 210 SDA/SDIO/SDI, pin 318 associated with existing pin 326) without backpowering the ASIC 702 by maintaining the high impedance at the pin (e.g., pin 210 SDA/SDIO/SDI, pin 318 associated with existing pin 326) when the ASIC 702 is powered off, as further described herein regarding FIGS. 1-6.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure illustrative purposes, various modifications are possible that are considered within the scope of such embodiments and examples, as those skilled in the relevant art can recognize. For example, while embodiments of the subject disclosure are described herein in the context of MEMS sensors (e.g., such as MEMS acoustic sensors, etc.), it can be appreciated that the subject disclosure is not so limited. For instance, as further detailed herein, various exemplary implementations can be applied to other areas of electronic devices, systems, and methods, without departing from the subject matter described herein.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. An apparatus comprising:
an application specific integrated circuit (ASIC) configured to interface with a communications bus via a pin of a package comprising the ASIC according to a communications protocol;
a first switching means for maintaining a high impedance at the pin when the ASIC is powered off, wherein the first switching means comprises a p-channel metal-oxide-semiconductor (PMOS) transistor coupled between the pin connected to the communications bus and a gate of a PMOS transmission transistor in a back to back transmission gate, and wherein the PMOS transistor is configured to maintain the PMOS transmission transistor off as a voltage level applied to the pin is held at a high level according to the communications protocol; and
a second switching means for enabling communications via the communications bus at the pin when the ASIC is powered on.

2. The apparatus of claim 1, wherein the communications bus comprises an open drain communications bus.

3. The apparatus of claim 2, wherein the open drain communications bus comprises an Inter-Integrated Circuit (I²C) bus or wherein the communications protocol is an implementation based at least in part on I²C communications protocols.

4. The apparatus of claim 1, further comprising:
at least one microelectromechanical systems (MEMS) sensor in the package comprising at least one of an acoustic sensor, a pressure sensor, a temperature sensor, an accelerometer, a vibratory rate gyroscopic sensor, or an environmental sensor.

5. The apparatus of claim 1, wherein the second switching means comprises a n-channel metal-oxide-semiconductor (NMOS) transistor coupled between the PMOS transistor and ground, and wherein the NMOS transistor is configured to turn the PMOS transmission transistor on according an enable signal from the ASIC when the ASIC is powered on.

6. The apparatus of claim 1, wherein the ASIC is configured to accept a multiplexed analog test signal on the pin without backpowering the ASIC by maintaining the high impedance at the pin when the ASIC is powered off.

7. An apparatus, comprising:
a package comprising an application specific integrated circuit (ASIC), wherein the ASIC is configured to interface with a communications bus via a pin of the package according to a communications protocol;
a p-channel metal-oxide-semiconductor (PMOS) transistor coupled between the pin and a gate of a PMOS transmission transistor in a back to back transmission gate, wherein the PMOS transistor is configured to maintain the PMOS transmission transistor off, with the ASIC powered off, as a voltage level applied to the pin is held at a high level according to the communications protocol; and
a n-channel metal-oxide-semiconductor (NMOS) transistor coupled between the PMOS transistor and ground, and wherein the NMOS transistor is configured to turn the PMOS transmission transistor on according an enable signal from the ASIC when the ASIC is powered on.

8. The apparatus of claim 7, wherein the PMOS transistor is configured to apply the voltage level applied to the pin at the high level to a gate of the PMOS transmission transistor to maintain the PMOS transmission transistor off and to block the voltage level applied to the pin at the high level when the ASIC is powered off.

9. The apparatus of claim 8, wherein the NMOS transistor is configured to short the gate of the PMOS transmission transistor to ground to maintain the PMOS transmission transistor on and to pass the voltage level applied to the pin at the high level when the ASIC is powered on.

10. The apparatus of claim 7, wherein the communications bus comprises an open drain communications bus.

11. The apparatus of claim 7, wherein a device comprising the ASIC is multiplexed on an I²C bus with at least one other device configured to communicate based at least in part on I²C protocols and is configured to be exposed to the voltage level applied to the pin at the high level.

12. The apparatus of claim 7, further configured to accept a multiplexed analog test signal on the pin without backpowering the ASIC by maintaining a high impedance at the pin when the ASIC is powered off.

13. An apparatus comprising:
an application specific integrated circuit (ASIC) communicatively coupled to at least one microelectromechanical systems (MEMS) sensor and configured to process at least one signal from the at least one MEMS sensor;
a package comprising the at least one MEMS sensor and the ASIC;
a pin of the package coupled between the ASIC and a communications bus according to a communications protocol;
a backpower-safe switch coupled between the ASIC and the pin, wherein the backpower-safe switch is configured to provide a high impedance at the pin when the ASIC is powered off, wherein the backpower-safe switch is further configured to enable communications with the communications bus according to the communications protocol when the ASIC is powered on, wherein the backpower-safe switch comprises a first switching means for maintaining the high impedance at the pin when the ASIC is powered off, and wherein the first switching means comprises a p-channel metal-oxide-semiconductor (PMOS) transistor coupled between the pin coupled to the communications bus and a gate of a PMOS transmission transistor in a back to back transmission gate, and wherein the PMOS transistor is configured to maintain the PMOS transmission transistor off as a voltage level applied to the pin is held at a high level according to the communications protocol.

14. The apparatus of claim 13, wherein the backpower-safe switch comprises a second switching means for enabling the communications via the communications bus at the pin when the ASIC is powered on.

15. The apparatus of claim 14, wherein the second switching means comprises a n-channel metal-oxide-semiconductor (NMOS) transistor coupled between the PMOS transistor and ground, and wherein the NMOS transistor is configured to turn the PMOS transmission transistor on according an enable signal from the ASIC when the ASIC is powered on.

16. The apparatus of claim 13, wherein the communications bus comprises an open drain communications bus.

17. The apparatus of claim 16, wherein the open drain communications bus comprises an Inter-Integrated Circuit (I$^2$C) bus or wherein the communications protocol is an implementation based at least in part on I$^2$C communications protocols.

18. The apparatus of claim 13, wherein the backpower-safe switch is further configured to accept a multiplexed analog test signal on the pin without backpowering the ASIC by maintaining the high impedance at the pin when the ASIC is powered off.

* * * * *